United States Patent
Jelinek et al.

(10) Patent No.: US 6,326,855 B1
(45) Date of Patent: Dec. 4, 2001

(54) VOLTAGE-TO-CURRENT CONVERTER CIRCUIT WITH INDEPENDENT AND ADJUSTABLE COMPENSATION FOR PROCESS, VOLTAGE, AND TEMPERATURE

(75) Inventors: Jules Joseph Jelinek, San Francisco; Michael Arthur Brown, San Jose; Ramin Shirani, Morgan Hill, all of CA (US)

(73) Assignee: Agere Systems, INC, Allentown, PA (US)

( * ) Notice: Subject to any disclaimer, the term of this patent is extended or adjusted under 35 U.S.C. 154(b) by 0 days.

(21) Appl. No.: 09/318,511

(22) Filed: May 25, 1999

Related U.S. Application Data (60) Provisional application No. 60/087,566, filed on Jun. 1, 1998, and provisional application No. 60/087,600, filed on Jun. 1, 1998.

(51) Int. Cl.[7] ................................. G05F 3/16; H03B 5/02
(52) U.S. Cl. ........................... 331/57; 331/34; 331/175; 331/176; 331/177 R; 327/103
(58) Field of Search ................. 331/34, 57, 175, 331/176, 177 R; 327/103

(56) References Cited

U.S. PATENT DOCUMENTS

| | | | |
|---|---|---|---|
| 5,061,907 | * 10/1991 | Rasmussen | 331/57 |
| 5,331,295 | * 7/1994 | Jelinek et al. | 331/57 |
| 5,847,616 | * 12/1998 | Ng et al. | 331/57 |
| 6,011,822 | * 1/2000 | Dreyer | 331/17 |

* cited by examiner

*Primary Examiner*—Siegfried H. Grimm (57) ABSTRACT

A voltage-to current (V-to-I) converter circuit for use in combination with a current-controlled oscillator (ICO) to form a voltage-controlled oscillator (VCO), wherein the V-to-I converter circuit provides a current to the ICO while this current ranges itself corresponding to the process, supply voltage, and temperature needs of the ICO, thus allowing a more stabilized ICO and VCO. In one embodiment, the V-to-I circuit allows for independent adjustability to compensate for each quantity of required process, supply voltage, and temperature. In another embodiment, the V-to-I circuit includes compensation circuitry for process and temperature only. There is no need for supply voltage compensation because the supply voltage for the V-to-I converter circuit is provided from a supply that has been linearly regulated and preferably built-in on the chip.

26 Claims, 9 Drawing Sheets

VOLTAGE-TO-CURRENT CONVERTER CIRCUIT WITH INDEPENDENT AND ADJUSTABLE COMPENSATION FOR PROCESS, VOLTAGE, AND TEMPERATURE

CROSS-REFERENCE TO RELATED APPLICATIONS

This application claims the benefit of U.S. Provisional Patent Application Serial No. 60/087,566, filed Jun. 1, 1998, and U.S. Provisional Patent Application Serial No. 60/087,600, filed Jun. 1, 1998.

BACKGROUND OF THE INVENTION

1. Technical Field

This invention relates generally to voltage-controlled oscillators (VCOs), and more particularly to converting a voltage to a current for use in a current-controlled oscillator (ICO) in which process, voltage, and temperature variations can be compensated independently.

2. Discussion of Background Art

Voltage controlled oscillators using Complementary Metal-Oxide Semiconductor (CMOS) technologies are known to be greatly affected by process, voltage supply, and temperature variations. U.S. Pat. No. 5,061,907 to Rasmussen and U.S. Pat. No. 5,331,295 to Jelinek et al. are directed to achieving automatic compensation for process, voltage, and temperature effects.

Rasmussen discloses a VCO that includes a multistage ring oscillator, a voltage-to-current converter, process compensation circuitry, and a trip-point compensation circuit. The voltage-to-current converter linearly converts an input signal to an output current signal that is independent of varying process and temperature effects on the transistor in the ring oscillator. The converter thus provides a variable control current. The process compensation circuitry responds to the tuning voltage input signal to provide a current dump output signal. However, this signal is dependent on the transistor strength, which in turn depends on the transistor fabrication process, supply voltage, and operating temperature. The trip-point compensation circuit subtracts the process compensation current from the voltage-to-current converter generated current to produce a net current.

Jelinek et al. discloses a VCO including a multistage ring oscillator, a first current source, a second current source, and an attenuator. The first current source provides a substantially constant current independent of process, supply voltage, and temperature. The second current source provides a current that varies in response to process, supply voltage, and temperature. Both current sources generate respective current signals independent of the input signal to the VCO. The attenuator, responsive to the VCO's input voltage signal, provides to the ring oscillator a control current signal which determines the frequency of oscillation of the ring oscillator.

Neither Rasmussen nor Jelinek et al. can control or regulate the quantity of process, voltage supply, and temperature compensation, or adjust each of these variables independently. Such ability is a common need in VCO designs.

SUMMARY OF THE INVENTION

The present invention provides a voltage-to-current (V-to-I) converter that can meet the process, voltage, and temperature-varying current needs of a current-controlled oscillator (ICO). It also provides a circuit designer the ability to independently adjust the amount of compensation for process, voltage, and temperature variations, and thereby minimize their effect on a VCO. Additionally, the ICO or a VCO utilizing the invention is better stabilized.

The V-to-I converter circuit receives an input voltage $V_{in}$ and, based on the voltage range of operation of $V_{in}$, converts $V_{in}$ to at least one output current $I_{out}$, which ranges itself according to the process, supply voltage, and temperature needs of the ICO. The V-to-I converter circuit includes an uncompensated current source, a compensated current generator, and a modulator. The uncompensated current source provides a current that is proportional to the strength of the p-channel transistors and is used to reduce the process effect on an associated ICO circuit. The compensated current generator includes adjustable and distinct components to compensate for each of process, supply voltage, and temperature effects. Thus, the compensated current generator generates a current that reflects the process, supply voltage, and temperature needs of the ICO over variations in process, supply voltage, and temperature. The modulator by itself is a process, supply voltage, and temperature stable circuit which receives the same voltage $V_{in}$ operating in a range and generates a current which ranges itself in response to the current needs of the ICO.

Less current $I_{out}$ from the V-to-I converter is provided when process, temperature, and voltage effects are strong, and more current $I_{out}$ is provided when process, temperature, and voltage effects are weak.

In another embodiment of the invention, the V-to-I converter includes circuits for process and temperature compensation only. Voltage compensation is optional since the voltage supply for the V-to-I converter circuit runs off a linearly regulated voltage supply in the same chip.

Current $I_{out}$ may be replicated to produce two or more similar currents to control two or more similar ICO circuits, separately or simultaneously. Similarly, the uncompensated current source's output current may be replicated to produce two or more similar output currents each independently feeding two or more similar compensated current generator circuits. The resulting circuit is therefore able to utilize one or more $I_{out}$ from different circuit configurations. In one example, only one of these compensated current generator circuits may be active for a given time period while sharing the modulator circuitry. In another example, each compensated current generator circuit may be connected to a corresponding separate instance of the modulator circuitry which in turn drives one or more separate and corresponding ICO circuits.

DETAILED DESCRIPTION OF THE PREFERRED EMBODIMENT

This invention comprises a voltage-to-current (V-to-I) converter circuit which enables adjusting the amount of compensation for process, voltage, and temperature (PVT) in an output current.

One example application is in an ICO as described in co-pending patent application Ser. No. 09/318/481, filed May 25, 1999, entitled "Current-Controlled Oscillator Circuit," which is filed by the same inventors as the present application and which is hereby incorporated by reference. Providing the desired ICO output frequency involves obtaining the current need of each ICO cell, which varies according to process, voltage, and temperature effects.

Variations in "process" are those arising during fabrication of the electronic element. Such variations typically occur from die-to-die or from wafer-to-wafer. The circuit of this invention receives an input voltage $V_{in}$ and, based on the $V_{in}$ range of operation, converts it to an output current that has a range corresponding to the process, voltage, and temperature needs of, for example, the ICO. In one embodiment of the invention, when input voltage $V_{in}$ ranges from about IV to about 3.8V, and depending upon the process, voltage, and temperature variation required by the ICO, an appropriate range of the output current, about 100 µA to 1 mA, is achieved. In another embodiment, the V-to-I converter circuit includes compensation circuitry for process and temperature only. There is no need for supply voltage compensation because the supply voltage for the V-to-I converter circuit is provided from a supply that is linearly regulated and is built-in on the same chip.

Figure 1:
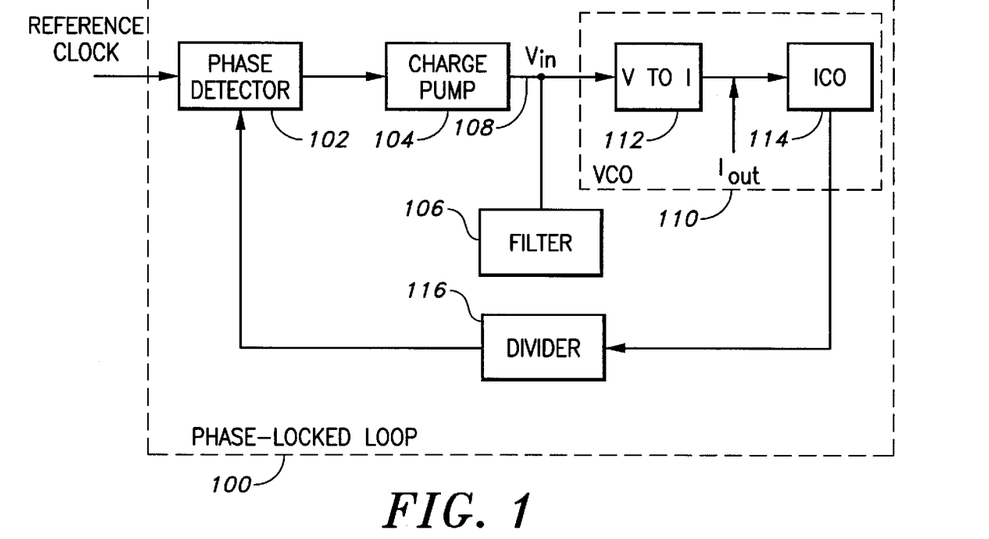
FIG. 1 is a block diagram of a Phase-Locked Loop (PLL) circuit in which the VCO is typically used.

FIG. 1 shows a phase-locked loop (PLL) 100 using the V-to-I converter circuit of the present invention. Phase detector 102 receives a reference clock signal input and feeds a charge pump 104 that is coupled to a filter 106, which provides a voltage $V_{in}$ on line 108 to VCO 110. VCO 110 includes V-to-I converter 112 and ICO 114, and outputs a frequency signal to divider 116, which provides feedback to phase detector 102.

Figure 2:
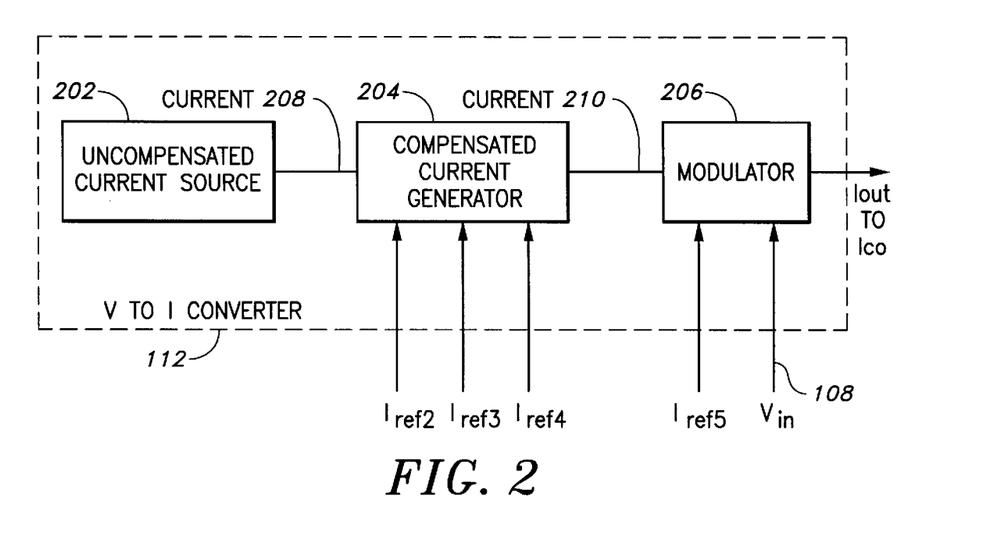
FIG. 2 is a block diagram of a voltage-to-current (V-to-I) converter according to the invention.

FIG. 2 is a block diagram of a preferred embodiment of V-to-I converter 112 in accordance with the present invention. Converter 112 includes an uncompensated current source 202, a compensated current generator 204, and a modulator 206. Inputs to V-to-I converter circuit 112 include a plurality of currents $I_{ref}$ ($I_{ref2}$, $I_{ref3}$, $I_{ref4}$, and $I_{ref5}$) and voltage $V_{in}$ on line 108, which is typically the voltage output of filter 106 of FIG. 1. Current $I_{ref}$ inputs are preferably precise references, such as those provided by the band gap reference-based current source 251 of FIG. 3B. However, a variation of about 10% to 15% is sufficiently precise in accordance with the invention. V-to-I converter 112 output $I_{out}$, provides current to ICO 114 of FIG. 1. A V-to-I converter circuit 112 comprising all p-channel transistors could have an advantage of improved noise isolation. However, the preferred embodiment includes some n-channel transistors in the V-to-I converter mirror circuitry for mirroring currents.

Uncompensated current source 202 provides current on line 208 within converter circuit 112. Because V-to-I converter 112 preferably works with an ICO 114 preferably having all-p-channel-transistors for improved noise isolation throughout the VCO, current source 202 should be proportional to the strength of the p-channel transistors in ICO 114.

In a transistor device, as the gain β increases, the threshold voltage $V_t$ decreases, the gate capacitance $C_{ox}$ of p-channel transistors increases, and the current source 202 output current on line 208 becomes larger. Correspondingly, as β decreases, $V_t$ increases and $C_{ox}$ decreases, the current source 202 output current on line 208 becomes smaller. The proportional relationship between the current on line 208 and the strength of p-channel transistors enables converter circuit 112 to compensate for the process effects varying from wafer to wafer or from wafer lot to wafer lot.

Compensated current generator 204 receives current 208 from uncompensated current source 202 and a plurality of currents $I_{ref}$, and provides current 210 to modulator 206. This current generator 204 includes components that allow the ability to independently adjust the amount of process, voltage, and temperature compensation for V-to-I converter circuit 112.

Modulator 206 receives as inputs, compensated current 210 from compensated current source 204, $V_{in}$, and an $I_{ref5}$ precision current input, which provides a precision voltage for modulator 206. Modulator 206 by itself is a process, supply voltage, and temperature stable current varying modulator which provides current $I_{out}$ to ICO 114 of FIG. 1. Current $I_{out}$ is a modulated and scaled copy of current 210. Current 210, provided to modulator 206, establishes the maximum current $I_{out}$ for the V-to-I converter circuit's processing parameters and the die temperature and supply voltage operating conditions. As $V_{in}$ changes, current $I_{out}$ travels between 0 and the scaled value of current 210. This results in a range of current $I_{out}$ times a scaling factor being provided to control ICO 114. Each stage of ICO 114 is then provided with a copy of current $I_{out}$. In effect, the more current $I_{out}$ is required from this V-to-I converter circuit 112 when the process is weak, and less current $I_{out}$ is required when the process is strong. Similarly, current $I_{out}$ increases as temperature increases (i.e. as it gets hotter) and decreases as temperature decreases (i.e. as it gets colder).

Figure 3A:
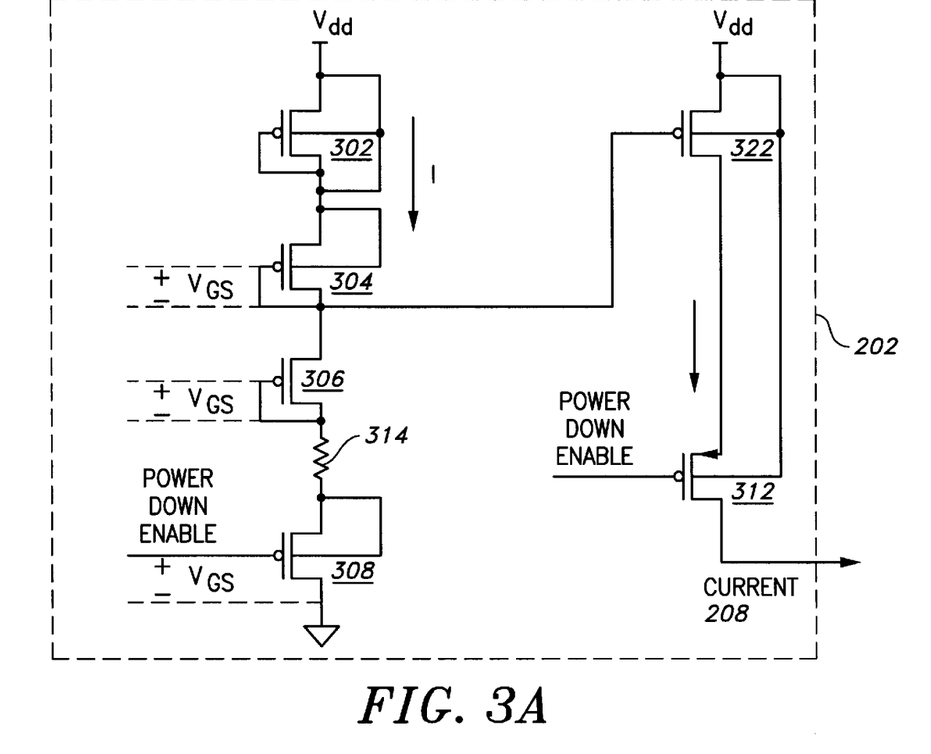
FIG. 3A shows a preferred embodiment of uncompensated current source 202 of FIG. 2.

FIG. 3A shows a preferred embodiment of uncompensated current source 202 of FIG. 2. Current source 202 includes diode-connected, preferably p-channel transistors 302, 304, 306, and 308, a resistor 314 coupled between transistors 306 and 308, a current sourcing transistor 322, and switch transistor 312. Resistor 314 is a linearizing resistor which minimizes and balances the process effects and variations of other resistors in compensated current generator 204. Precision current circuit transistor 302 is shorted out where minimal input supply voltage variation is specified or linear regulated supply voltage is provided for. In cases where a linear regulator is not used or minimal input supply voltage variation is not specified, transistor 302 is usually needed to reduce headroom between the supply and ground potentials so as to reduce supply voltage variation in current 208. Output current 208 can be varied depending on the setting of resistor 314 and transistor 322. The smaller resistor 314, the larger the voltage on transistor 304 and hence current 208. Similarly, output current 208 can be varied by increasing or decreasing the size of transistor 322. In one embodiment, the range of current 208 is about 20–80 µA.

In this FIG. 3A, the current I flowing in the p-channel transistor stack (comprising transistors 304, 306, and 308) can be determined by first writing the equation for the supply voltage as follows:

$$V_{sup}=3V_{GS}+IR$$

where $V_{sup}$ represents the stacks supply voltage ($V_{dd}$ in FIG. 3A); $V_{GS}$, the voltage across one of the three p-channel transistors; I, the current following in the transistor stack; and R the value of the resistor incorporated in the stack. Rearranging this equation for $V_{GS}$ yields:

$$V_{GS}=(V_{sup}-IR)/3.$$

Utilizing the basic Metal-Oxide Silicon Field Effect Transistor (MOSFET) equation in the saturation region and substituting for $V_{GS}$ yields the following expression representative of the current flowing in the transistor stack:

$$I=\tfrac{1}{2}U_pC_{ox}*W/L*((V_{sup}-IR)/3-V_t)^2,$$

where $U_p$ is the mobility of electrons in a p-channel transistor; $C_{ox}$, represents the capacitance of the transistor gate; W and L, the width and length of the p-channel transistors (302, 304, 306, and 308); and $V_t$, the threshold voltage of the p-channel transistors. From this equation, current 208 in this transistor stack varies by process effect on parameters $U_p$, $C_{ox}$, $V_t$, and geometry idiosynchracies in W and L; temperature effects on $U_p$; and changes in $V_{sup}$, and R. Additionally, current 208 in this embodiment contains unwanted sensitivity to temperature, supply voltage, and resistor value variation. The resulting stack current is then mirrored and optionally scaled by p-channel transistor 322 and output as current 208.

Figure 3B:
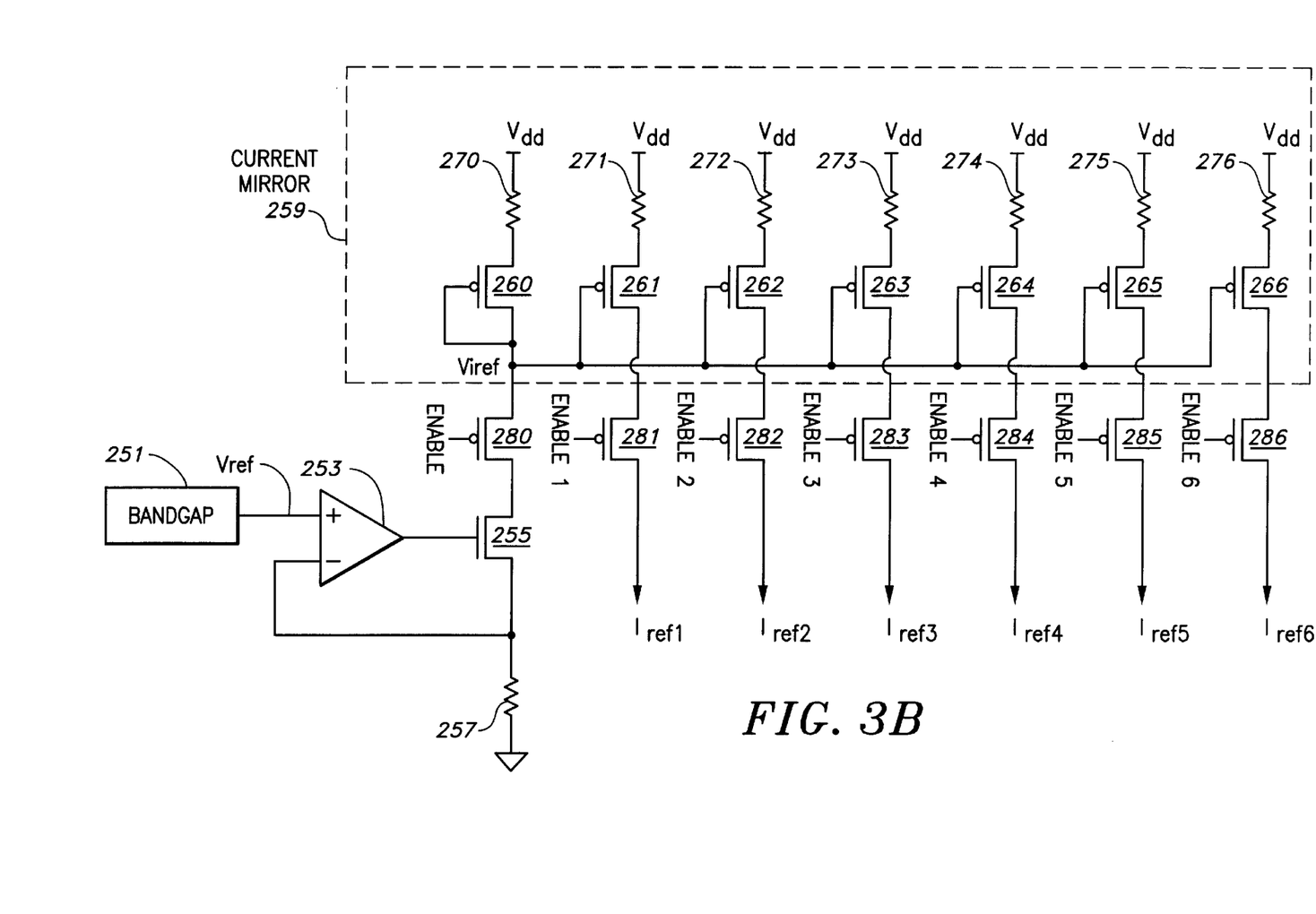
FIG. 3B shows a preferred embodiment of precision current sources.

FIG. 3B shows a preferred embodiment of precision current sources that may be used to generate currents $I_{ref}$ of FIG. 2. Bandgap 251 provides a precision reference voltage $V_{gap}$, which typically varies by less than one hundred milli-volts regardless of the applied supply voltage to the circuit. This reference voltage $V_{gap}$ is then used in connection with amplifier 253, transistor 255, and resistor 257. The output of amplifier 253 adjusts the gate voltage on transistor 255 such that the current $I_{ref}$ flowing through transistors 280 and 255 and across resistor 257 results in the voltage across resistor 257, equaling the voltage supplied by bandgap 251. Thus, the output current $I_{ref}$ is approximately $V_{gap}$ divided by the value of resistor 257. Similar additional $I_{ref}$ currents and ratioed versions of $I_{ref}$ current are then generated by current mirroring stage 259. Mirroring stage 259 is shown with six $I_{ref}$ based current output branches comprising transistors 260, 261, 262, 263, 264, 265, and 266; and resistors 270, 271, 272, 273, 274, 275, and 276. Diode connected transistor 260 in combination with resistor 270 establishes a voltage $V_{iref}$, based on $I_{ref}$. Voltage $V_{iref}$, when applied to identically sized transistors and resistors, generates additional copies of current $I_{ref}$. When $V_{iref}$ is applied to a transistor, whose size with respect to the size of transistor 260 varies by a ratio of 1:n in combination with a resistor, whose size with respect to the size of resistor 270, varies by a ratio of n:1, a current of ratio 1:n times the reference current $I_{ref}$ is generated.

Figure 4A:
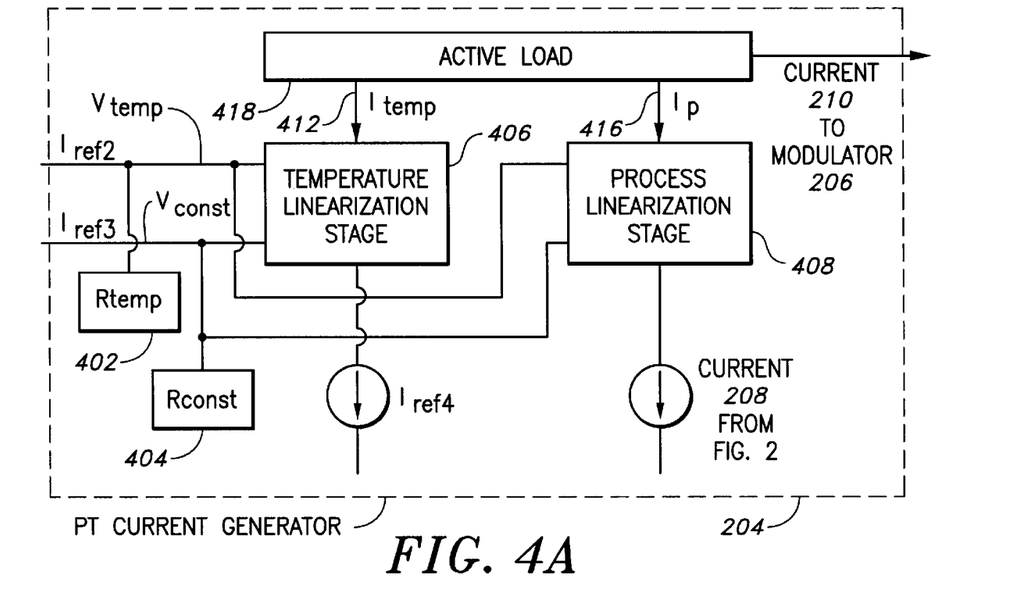
FIG. 4A is a block diagram of a first embodiment of compensated current generator 204 of FIG. 2, which is PT compensated.
Figure 4B:
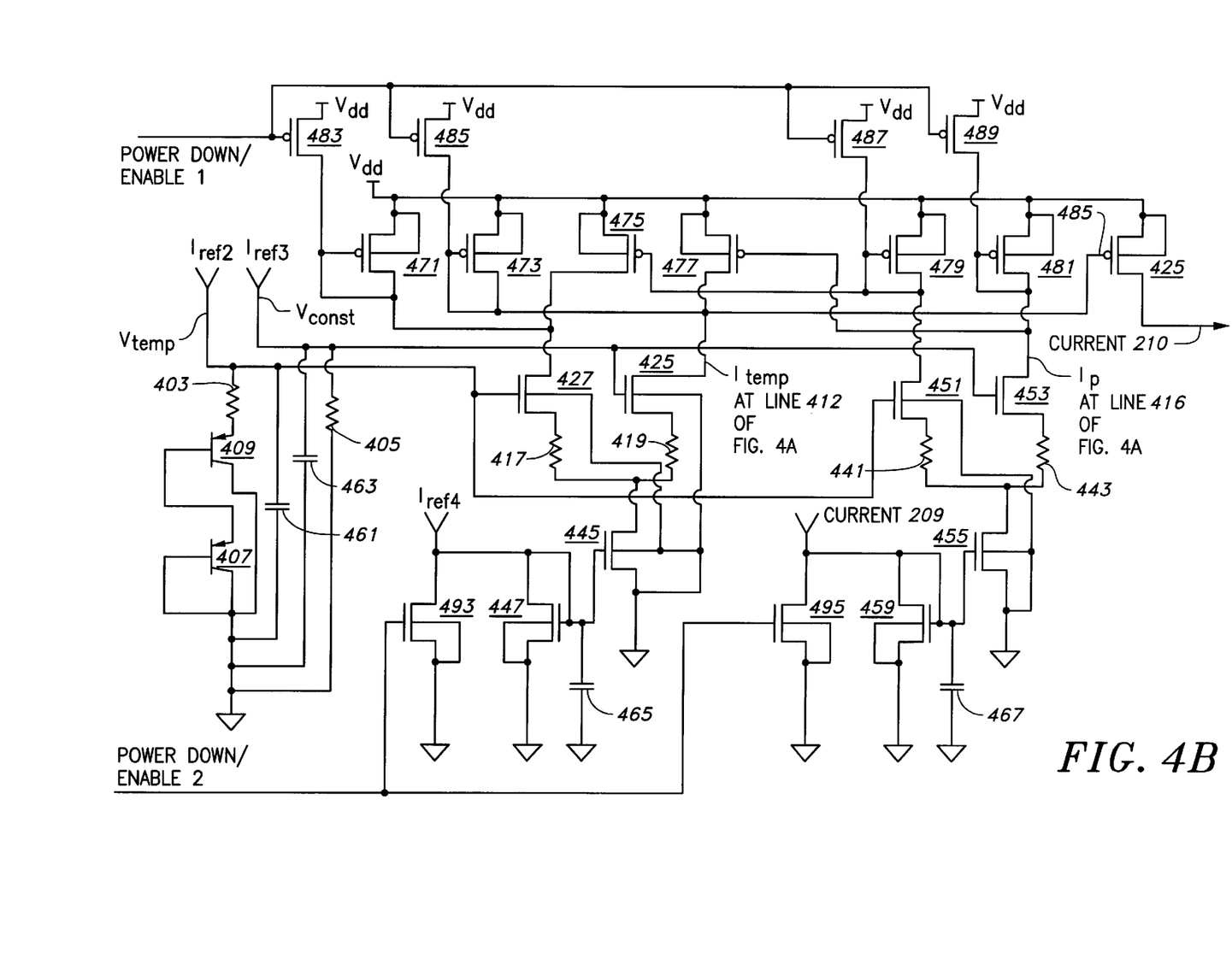
FIG. 4B shows details of a preferred embodiment of the PT compensated current generator of FIG. 4A.

FIGS. 4A and 4B show a block diagram and circuit representation, respectively, for a preferred embodiment of a PT current generator 400, which is a first embodiment of compensated current generator 204 of FIG. 2. PT current generator 400 compensates for process and temperature, but does not include supply voltage compensation circuitry because PT current generator 400 is preferably used in conjunction with a supply voltage that has been linearly regulated and preferably built-in on the chip comprising V-to-I converter circuit 112. This regulated supply voltage eliminates the supply voltage variance that would otherwise be potentially generated in current 208 by uncompensated current source 202.

PT current generator 400 includes two resistive stacks $R_{temp}$ 402 and $R_{const}$ 404, a temperature linearizing stage 406, a process linearizing stage 408, and an active load 418. Resistive stacks 402 and 404 receive preferably identical currents $I_{ref2}$ and $I_{ref3}$. In one embodiment, each of $I_{ref2}$ and $I_{ref3}$ is preferably 100 µA, and creates respective voltages $V_{temp}$ and $V_{const}$, which will be discussed with reference to FIG. 4B. At the midpoint of process and temperature (typical case transistors and 70° C.) $V_{const}$ and $V_{temp}$ preferably are identical and made effected in the same way to eliminate resistor processing variations.

Temperature linearizing stage 406 receives $V_{temp}$ and $V_{const}$ as inputs to modulate current $I_{ref4}$ and reflects it in current $I_{temp}$ at line 412. Current 208 acts as a current source for process linearizing stage 408. Process linearizing stage 408 also receives $V_{temp}$ and $V_{const}$ as inputs, and therefore process current 208 is also modulated by the same two voltages $V_{temp}$ and $V_{const}$, and is reflected on current $I_p$ flowing at line 416. Consequently, the temperature-only current $I_{ref4}$ and process-only current 208 are linearized and reflected on current $I_{temp}$ at line 412 and $I_p$ at line 416, respectively. These latter two currents $I_{temp}$ and $I_p$ are then combined through active load 418 to produce current 210. Temperature-only current $I_{temp}$ at line 412 and process-only current $I_p$ at line 416 are independently adjustable by varying the magnitude of $I_{ref4}$, current 208, and the value of linearization stage resistors in stages 406 (resistors 417 and 419 in FIG. 4B) and 408 (resistors 441 and 443 in FIG. 4B), thereby allowing independent adjustment for temperature and process effects, respectively.

FIG. 4B shows a preferred embodiment of PT current generator 400 of FIG. 4A. Resistors 403 and 405 and parasitic bipolar transistors 407 and 409 form resistive stacks 402 and 404. Parasitic transistors 407 and 409 are preferably pnp bipolar transistors because pnp transistors are notorious in the art for their susceptibility to temperature effects. They can drop a few hundred milli-volts over normal operating temperature.

Sizing resistive stack 402 (FIG. 4A) such that the voltage drop across resistor 403 in combination with bipolar transistors 407 and 409 equals the voltage drop across resistor 405 results in $V_{const}$ and $V_{temp}$ being identical voltages. Resistors 403 and 405 are preferably made of the same type so that voltages $V_{temp}$ and $V_{const}$ are effected in the same way. Since resistive stack 402 includes two parasitic bipolar transistors 407 and 409, $V_{temp}$ is capable of varying by plus or minus 300 mV with respect to $V_{const}$. $V_{temp}$, resulting from $I_{ref2}$ going through resistor 403 and parasitic transistors 407 and 409, reflects temperature effects caused by bipolar transistors 407 and 409. $V_{const}$ is thus independent of process, supply voltage, and temperature. If $I_{ref2}$ equals $I_{ref3}$, process effects will vary both resistors 403 and 405, and the resistors in the band gap current source (FIG. 3B) identically leaving bipolar transistors 407 and 409 as a temperature sensor.

Transistors 471, 473, 475, 477, 479, and 425 form active load 418.

Transistors 427 and 429, coupled to two linearizing resistors 417 and 419, form temperature linearizing stage 406. Current $I_{ref4}$ provided to transistor pair 427 and 429 is linearized by linearization resistors 417 and 419. Transistor 445 acts as a current source for transistor pair 427 and 429, and in effect, current $I_{ref4}$ is mirrored through transistor 447 into transistor 445. The drains of transistors 427 and 429 are then connected to transistors 471 and 473 of active loads 418. As $V_{temp}$ varies with respect to $V_{const}$, the current flowing in transistors 427 and 429 is determined by the change in differential pair voltage and the value of resistors 417 and 419. Resistors 417 and 419 can be increased or decreased to adjust the amount of temperature compensation provided.

Transistors 451 and 453, coupled to two linearizing resistors 441 and 443, form process linearizing stage 408. By adjusting resistors 441 and 443 together, the required amount of temperature variance and removal of any excess non-desired temperature effects present in process current 208 can be greatly reduced or considered eliminated. This provides a way for unwanted temperature effects present in current 208 to be canceled out and any required temperature variations in current 208 to be added. Since process linearizing stage 408 preferably includes resistors of an identical process type to those used for resistor 314 (FIG. 3A), process variations in the value of resistor 314 are generally minimized by similar process variation effects occurring in resistors 441 and 443.

Consequently, the process-only current 208 is linearized by transistors 451 and 453 and resistors 441 and 443, and then mirrored by transistors 479, 481, 477, and 475 in active load 418. Transistors 479 and 481 provide loading to transistor pair 451 and 453 and mirror their respective currents through transistors 475 and 477. The mirrored currents from transistors 477 and 475 are then combined with those in load transistors 471 and 473. The resulting voltage across transistor 473 represented by line 412 is determined by the current flowing from transistor pair 427 and 429 and the mirrored current flowing from transistor pair 451 and 453. This resulting line 412 voltage, when applied to the gate of transistor 425 at line 485, results in a combined current flowing from transistor 425 to create current 210, which is independently adjustable by varying the magnitude of $I_{ref4}$, current 208 and the value of resistors 417, 419, 441 and 443.

Capacitors 461, 463, 465, and 467 are added for noise de-coupling purposes.

Transistors 483, 485, 487, and 489 are added between the gates of respective transistors 471, 473, 479, and 481 and controlled by a power down and enable signal. When the circuit is powered down, transistors 483, 485, 487, and 489 are turned on and thus pull the gate voltages of transistor 471, 473, 479, and 481 to $V_{dd}$. This results in 0V bias across transistors 471, 473, 479, and 481 such that the circuit consumes zero current in the power down mode. Similarly, transistors 493 and 495 are turned on in power down mode to provide a low resistance connection such that transistors 447, 445, 459, and 455 sink no current when transistors 308 (FIG. 3A) and 284 (FIG. 3B) are turned off. When transistors 262 and 283 (FIG. 3A) are also turned off in power down mode further power saving results as resistive stacks including resistors 403 and 405 and transistors 407 and 409 no longer draw current.

Figure 4C:
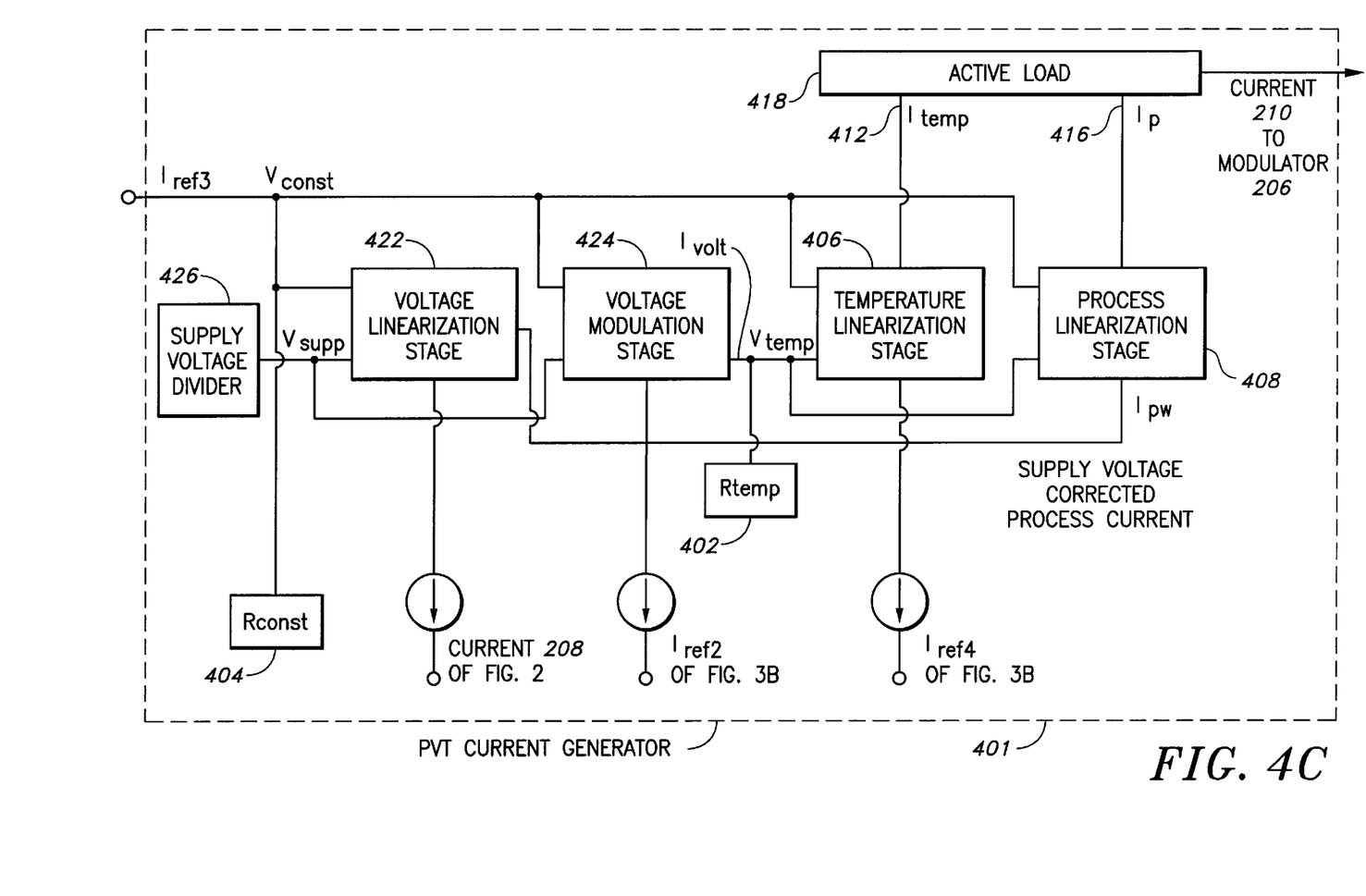
FIG. 4C is a block diagram of a second embodiment of compensated current generator 204 of FIG. 2, which is PVT compensated.

FIG. 4C shows a block diagram a PVT current generator 401, which is a second preferred embodiment of compensated current generator 204 of FIG. 2. In addition to compensation for process and temperature, PVT current generator 401 also compensates for variations in supply voltage ($V_{dd}$). This embodiment is more appropriate in cases where a linear regulator is not utilized. Consequently, in addition to elements 402, 404, 406, 408, and 418 of FIG. 4A, PVT current generator 401 further includes a voltage linearization stage 422, a voltage modulating stage 424, and an additional input voltage $V_{sup}$ provided by a supply voltage divider 426. As $V_{sup}$ varies with respect to $V_{const}$, the resulting differential voltage sensed by voltage linearization stage 422 and voltage modulating stage 424 changes by several hundred milli-volts as the supply voltage traverses its expected range.

In response to the changes in $V_{sup}$ and $V_{const}$, Voltage modulating stage 424 adds supply voltage effects to $I_{ref2}$. Thus, in this second embodiment resistive stack $R_{temp}$ 402 receives current $I_{volt}$ instead of $I_{ref2}$ directly as in the case of PT generator 400. As a result, not only $V_{temp}$ changes in response to temperature effects on parasitic transistors 407 and 409 as in PT generator 400, but also changes in response to the supply-voltage-based changes in current $I_{volt}$. Consequently, both linearizing stage 406 and process linearizing stage 408 are responsive to changes in temperature and supply voltage variation.

Voltage linearization stage 422 similarly modulates process current 208 to reduce and/or eliminate unwanted supply voltage variation effects in process current 208. Process current 208, which is the current source for voltage linearization stage 422, is corrected for adverse supply voltage effects by voltage linearization stage 422 and is then temperature adjusted by process linearization stage 408. In effect, process based current 208 is modulated by voltage inputs $V_{sup}$ and $V_{const}$ to voltage linearization stage 422, resulting in supply voltage corrected current $I_{pv}$, which is then temperature corrected by process linearizing stage 408. The resulting current is reflected at line 416, which is then mirrored into line 412 and, through active load 418, combined with temperature linearizing stage 406's output current.

Figure 4D:
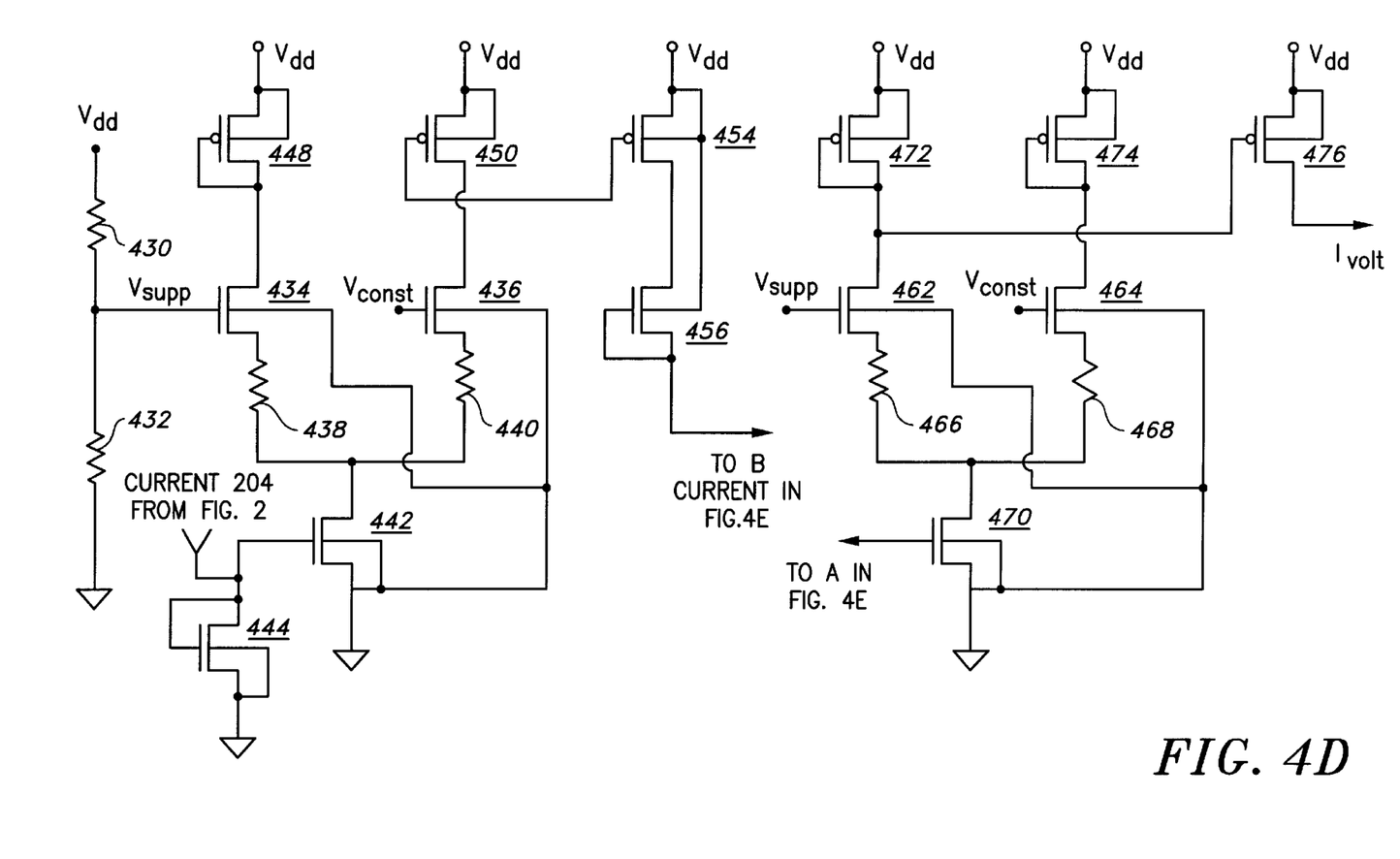
FIGS. 4D and 4E show details of a preferred embodiment of the PVT current generator of FIG. 4C.
Figure 4E:
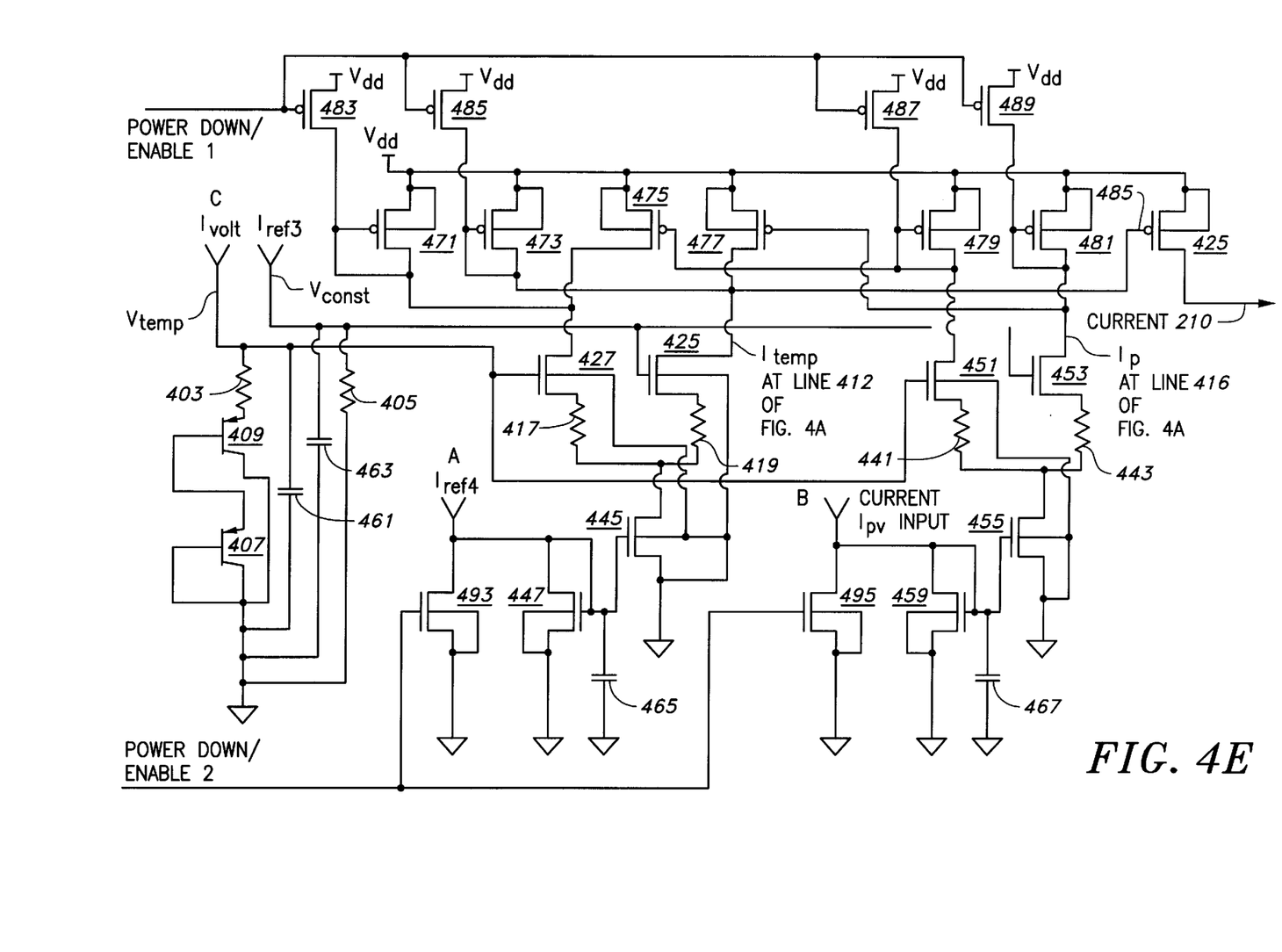

FIGS. 4D and 4E show a preferred embodiment of PVT current generator 401. Transistors 434 and 436, coupled with resistors 438 and 440, form voltage linearization stage 422 of FIG. 4C. Transistors 442 and 444 receive process current 208 and pass it to resistor pairs 438 and 440. Transistors 448 and 450 are load transistors with transistor 454 mirroring the current flowing in transistor 450 through transistor 456.

Transistors 462 and 464, coupled with resistors 466 and 468, form voltage modulating stage 424. Transistor 470 mirrors current $I_{ref4}$ flowing in transistor 447 (FIG. 4B) and passes it to resistor pair 466 and 468 and transistor pair 462 and 464. Transistors 472 and 474 are symmetrical loads with transistor 476 mirroring the current flowing in transistor 472 as current $I_{volt}$.

Resistors 430 and 432 form supply voltage divider 426 of FIG. 4C.

FIG. 4E is identical to FIG. 4B, except that current 208 going through transistors 459 in FIG. 4B at point B, has been replaced by supply voltage corrected process current $I_{pv}$ of FIG. 4C. Additionally, $I_{ref2}$ of FIG. 4B has been replaced with $I_{volt}$ of FIG. 4C.

Figure 5A:
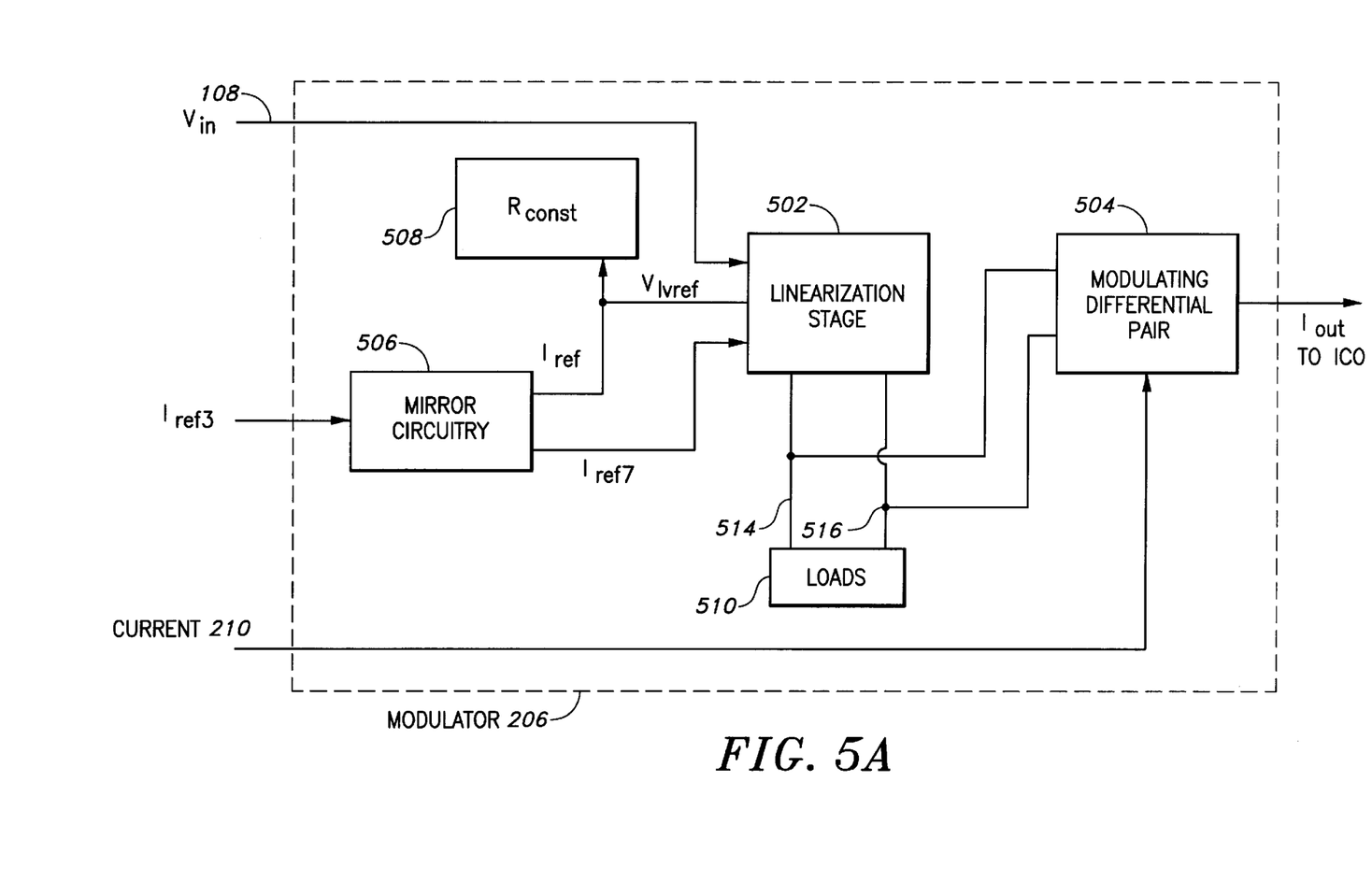
FIG. 5A is a block diagram of modulator 206 of FIG. 2.

FIG. 5A, shows a block diagram of a preferred embodiment of modulator 206, which includes a linearizing stage 502, a modulating differential pair 504, a mirror circuit 506, a voltage setting resistor $R_{const}$ 508, and preferably a p-channel transistor load 510. $I_{ref5}$, going through mirror circuit 506, provides $I_{vref}$ and $I_{ref7}$. $I_{vref}$, then going through resistor 508, provides precision voltage $V_{ivref}$, which is based on precision current $I_{ref5}$. In one embodiment, the value of $V_{ivref}$ is set at approximately half the supply voltage. $I_{ref7}$ is a copy of $I_{ref}$ after being mirrored through mirror circuit 506.

Linearizing stage 502 receives, as inputs, $V_{in}$, $V_{ivref}$, and $I_{ref7}$, and is coupled to load 510. $V_{in}$ modulates current 210, which is provided to modulating pair 504, and $V_{in}$, by moving in its ranges in comparison to $V_{ivref}$, results in current $I_{out}$ traversing a corresponding range. $I_{ref7}$, being linearized by linearizing stage 502 drives transistor load 510 through lines 514 and 516. When the process is strong, the linearized current at lines 514 and 516 causes a very small differential voltage to resolve per amount of change between $V_{in}$ and $V_{ivref}$. When the process is weak, the same current change will cause a much larger swing across the two transistors (525 and 527 of FIG. 5B) in differential pair 504. Load 510 preferably includes two p-channel transistors (517 and 519 in FIG. 5B), which, in juxtaposition with modulating differential transistor pair 504 (transistors 525 and 527 in FIG. 5B), create a process adjusted differential voltage. Since transistor pairs 517 and 519 in load 510 and transistor pair 525 and 527 in modulating differential pair 504 are preferably of the same p-channel transistor type, most of the processing effect is cancelled out. Thus, current 210 is attenuated by differential pair 504 according to this process adjusted differential voltage provided by linearizing stage 502 in response to $V_{in}$ moving in its range, in comparison to $V_{ivref}$. Effectively, there is created a voltage $V_{in}$ to current $I_{out}$ translation.

Current 210, provided as input to modulating differential pair 504, traverses a wide range but is linearized, and there is a conversion of voltage to current going through modulating pair 504. In an exemplary embodiment, current 210 ranges from approximately 60 μA to 250 μA. Modulating differential pair 504 receives current 210 as input, and the process adjusted differential voltage at lines 514 and 516 determines the amount of current 210 that is multiplied by a multiplication factor and mirrored out, as current $I_{out}$. In one embodiment, under weak process and high temperature, current 210 reaches approximately 250 μA with $I_{out}$ traversing approximately a four times range of 0 μA to 1000 μA in response to $V_{in}$'s active range. When process is fast (strong) and temperature is low current 210 is closer to 60 μA with $I_{out}$ traversing the approximate four times range of 0 μA to 250 μA. The circuit can be configured to provide various distinct quantities and values of $I_{out}$. In one embodiment, the maximum value of current 210, and hence $I_{out}$, varies by a factor of four over the range of projected changes in process, voltage, and temperature.

Figure 5B:
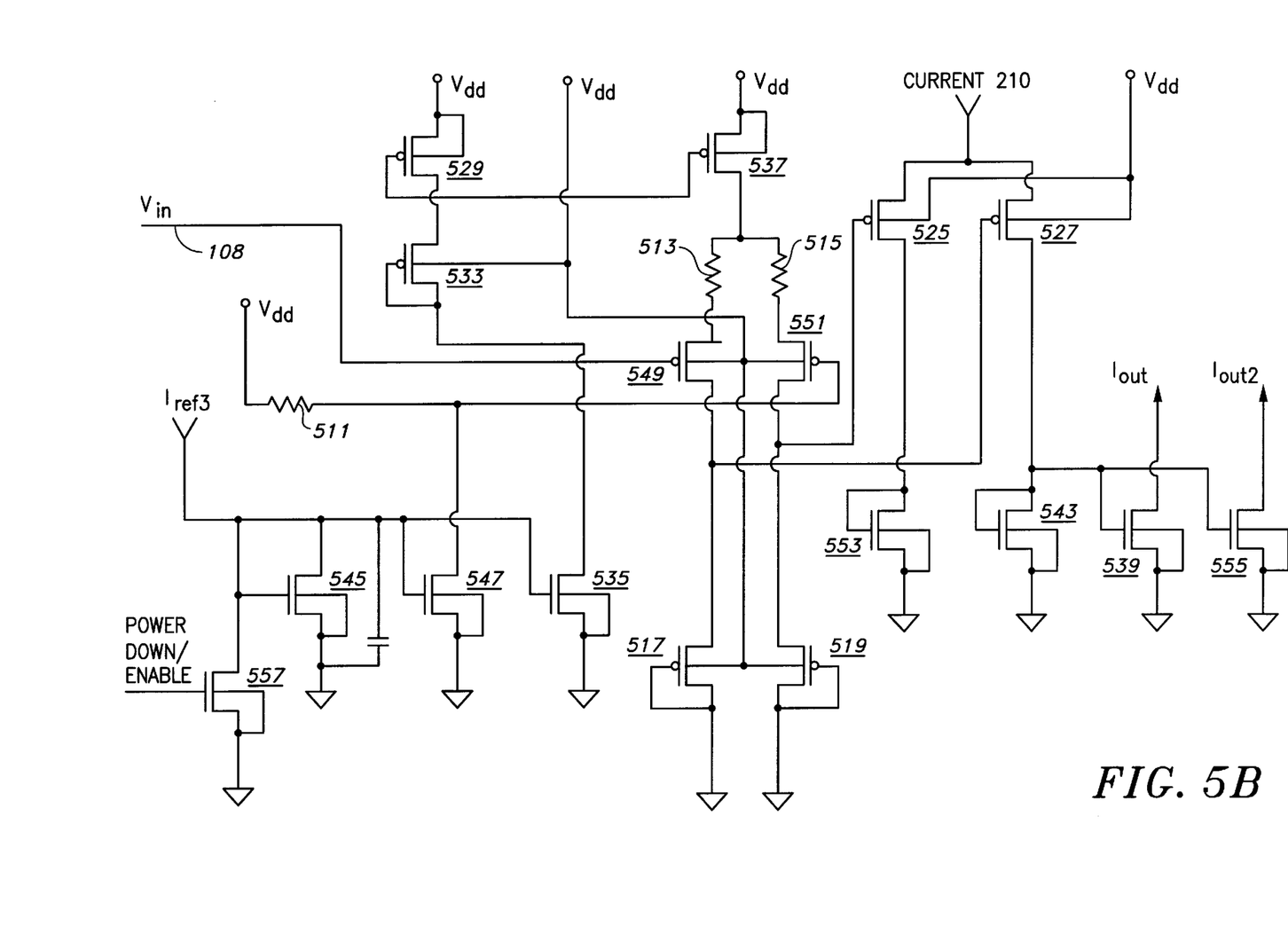
FIG. 5B shows details of a preferred embodiment of the modulator of FIG. 5A.

FIG. 5B shows a preferred circuit of modulator 206. Transistors 545, 547, 535, 533, 529, and 537 form mirror circuit 506 of FIG. 5A. Transistors 545 and 535 form a mirror that mirrors $I_{ref5}$ through transistor 533 and current mirroring transistors 529 and 537 into resistors 513 and 515. Transistor 547 provides current to voltage setting resistor 511 that creates $V_{ivref}$ of FIG. 5A. Transistor 533 acts as a voltage spacer to reduce noise effects by maintaining an equal number of transistors in each transistor/amplifier stack. Transistors 549 and 551 and resistors 513 and 515 form linearizing stage 502 of FIG. 5A. Transistors 517 and 519 form p-channel transistor load 510.

Transistors 525 and 527 form modulating differential pair 504, with two transistors 553 and 543 acting as their loads and transistor 543 forming part of a mirror to mirror out the resulting current along with transistor 539 and/or 555. Depending on the amount of the required $I_{out}$, the size of transistors 539 and/or 555 is selected accordingly to provide the appropriate amount of current multiplication for $I_{out}$. In one embodiment, transistor 539 is selected as four times larger than transistor 543, providing a current multiplication factor of four in the modulated quantity of $I_{out}$. As modulator 206 is capable of providing a plurality of values of $I_{out}$, transistor 555 provides a second output $I_{out2}$. Additional transistors similar to transistor 539 or 555 can provide further $I_{out}$ outputs for use by other ICO circuitry.

The present invention has been explained with reference to various preferred embodiments. Other embodiments will be apparent to those skilled in the art in light of this disclosure. For example, the present invention may be implemented using configurations other than p-channels transistors as described in the preferred embodiment above. Additionally, the present invention may effectively be used in combination with various types of ICO other than those described in the preferred embodiments. Therefore, these and other variations upon the preferred embodiments are intended to be covered by the appended claims.

What is claimed is:

1. A voltage-to-current converter circuit for receiving an input voltage and, based on the voltage operation range of said voltage, converts said input voltage to at least one control current for use in a current-controlled oscillator, comprising:

a current source for providing a source current;

a current generator for receiving said source current, a first current, a first voltage, and a second voltage, and for providing a current-generator current; and a modulator for receiving said input voltage, said current-generator current, and a second current, and for generating said control current, wherein said control current ranges according to process, supply voltage, and temperature needs of said current-controlled oscillator.

2. The circuit of claim 1, wherein said source current is proportional to the strength of a p-channel type of transistors in said current-controlled oscillator.

3. The circuit of claim 1, wherein said current source comprises linearizing resistors for eliminating resistive effects of said circuit.

4. The circuit of claim 1, wherein said current generator comprises adjustable components for independently adjusting the amount of process, supply voltage, and temperature variations.

5. The circuit of claim 1, wherein said current generator comprises:

a temperature linearizing stage for receiving said first voltage, said second voltage, and said first current, and for providing a temperature-compensated current; and a process linearizing stage for receiving said first voltage, said second voltage, and said source current for providing a process compensated current;

wherein said current generator combines said temperature-compensated current and said process-compensated current to provide a generator current.

6. The circuit of claim 5, wherein said temperature linearizing stage comprises:

a transistor pair; and a linearizing resistor pair coupled to said transistor pair;

wherein said first current and said linearizing resistors are adjustable to provide for adjustment of the amount of required temperature compensation of said circuit.

7. The circuit of claim 5, wherein said process linearizing stage comprises:

a transistor pair; and a linearizing resistor pair coupled to said transistor pair;

wherein said source current and said linearizing resistors are adjustable for providing the ability to adjust the amount of required process compensation.

8. The circuit of claim 5, wherein said current generator further comprises;

a first resistor;

a second resistor; and a pnp transistor pair coupled to said first resistor;

wherein said current generator further receiving:

a second current flowing through said first resistor and said pnp transistor pair for generating said first voltage; and a third current flowing through said second resistor for generating said second voltage.

9. The circuit of claim 1, wherein said first voltage is generated by a third current, and said second voltage is generated by a fourth current; said first current, said second current, said third current, and said fourth current are precision currents.

10. The circuit of claim 9, wherein said current generator comprises:

a voltage linearization stage for receiving said second voltage, a third voltage, and said source current for providing a voltage linearized current;

a voltage modulating stage for receiving said second voltage, said third voltage, and said third current for providing a supply-voltage-modulated current;

a temperature linearizing stage for receiving said second voltage, a fifth voltage, and said first current for providing a temperature-and-supply-voltage-compensated current;

a process linearizing stage for receiving said second voltage, said fifth voltage, and said voltage-linearized current for providing process-and-supply-voltage-compensated current;

wherein said current generator combines said temperature-and-supply-voltage-compensated current and said process-and-supply-voltage-compensated current to provide a generator current.

11. The circuit of claim 10, wherein said third voltage is provided by a supply voltage of said circuit.

12. The circuit of claim 10, wherein said voltage linearization stage further comprises:

a transistor pair; and a resistor pair coupled to said transistor pair.

13. The circuit of claim 10, wherein said voltage modulating stage further comprises:

a transistor pair; and a resistor pair coupled to said transistor pair.

14. The circuit of claim 10, wherein said temperature linearizing stage further comprises:

a transistor pair;

a linearizing resistor pair coupled to said transistor pair.

15. The circuit of claim 10, wherein said process linearizing stage further comprises:

a transistor pair; and a linearizing resistor pair coupled of said transistor pair.

16. The circuit of claim 1, wherein said modulator comprises:

a linearizing stage for receiving said input voltage and said second current for providing a linearized voltage pair; and a modulating stage for receiving said linearized voltage pair and said current-generator current for providing said control current.

17. The circuit of claim 16, wherein said linearizing stage comprises:

a linearizing transistor pair;

a linearizing resistor pair coupled to said linearizing transistor pair;

a compensating transistor pair coupled to said linearizing transistor pair.

18. The circuit of claim 17, wherein said modulating stage comprises:

a modulating transistor pair, coupled to said linearizing transistor pair and said compensating transistor pair;

wherein said compensating transistor pair and said modulating transistor pair are of the same type.

19. The circuit of claim 18, wherein said compensating transistor pair and said modulating transistor pair are p-channel type.

20. A method for converting an input voltage to at least one control current for use in a current-controlled oscillator comprising the steps of:

providing a current source for generating a source current;

providing a current generator for receiving said source current, a first current, a first voltage, and a second voltage, and for generating a current-generator current; and providing a modulator for receiving said input voltage, said current-generator current, and a second current, and for providing said control current.

21. The method of claim 20, wherein said source current is proportional to the strength of a channel type of transistors in said current-controlled oscillator.

22. The method of claim 20, wherein said current source comprises linearizing resistors for eliminating resistive effect of said circuit.

23. The method of claim 20, wherein said current generator comprises adjustable components for independently adjusting the amount of process, supply voltage, and temperature variations.

24. A process, supply voltage, and temperature independent voltage-controlled oscillator circuit comprising:

a voltage-to-current converter circuit for receiving an input voltage and, based on the voltage operation range of said input voltage, converts said input voltage to provide at least one control current; and a current-controlled oscillator circuit for receiving said control current and providing an output frequency;

wherein said control current ranges according to process, voltage, and temperature needs of said current-controlled oscillator.

25. The voltage-controlled oscillator of claim 24 wherein said voltage-to-current converter circuit comprises:

a current source for providing a source current;

a current generator for receiving said source current, a first current, a first voltage, and a second voltage, and for providing a current-generator current; and a modulator for receiving said input voltage, said current-generator current, a third voltage, and a second current, and for generating said control current.

26. The voltage-controlled oscillator of claim 24 wherein said current-controlled oscillator circuit comprises:

a first current mirroring circuit for receiving said control current and for providing a first control voltage;

a ring oscillator for receiving said first control voltage;

a second current mirroring circuit for receiving a first current and for generating a second control voltage; and at least one amplification circuit for receiving said second control current and for generating at least one amplification current.

* * * * *